United States Patent [19]

De Los Santos

[11] Patent Number: 6,111,472

[45] Date of Patent: Aug. 29, 2000

[54] QUASI-OPTICAL AMPLIFIER

[75] Inventor: Hector J. De Los Santos, Del Aire, Calif.

[73] Assignee: Hughes Electronics Corporation, El Segundo, Calif.

[21] Appl. No.: 09/136,590

[22] Filed: Aug. 19, 1998

[51] Int. Cl.[7] ................................. H03H 7/00; H01P 5/12
[52] U.S. Cl. ........................ 331/96; 331/117 D; 331/46; 330/4.9; 257/21; 359/344
[58] Field of Search .................................. 331/96, 117 D, 331/46; 359/333, 344, 353; 333/12, 202, 247; 372/44, 50; 257/17, 21; 327/514; 330/4.9

[56] References Cited

U.S. PATENT DOCUMENTS 3,828,231  8/1974  Yamamoto .
5,818,309  10/1998  De Los Santos ........................ 333/176
5,923,225  7/1999  De Los Santos .................... 333/202 X

*Primary Examiner*—Arnold Kinkead
*Attorney, Agent, or Firm*—Terje Gudmestad; M. W. Sales

[57] ABSTRACT

A launch quasi-optical amplifier including a photonic bandgap crystal, designed to operate within a specific frequency range. The photonic bandgap crystal is populated with active devices that are coupled to the alternate layers, or defects, in the crystal to compensate for the absorption in the alternate layers thereby creating a negative absorption coefficient. The photonic bandgap crystal is operable as an amplifier when the active devices are amplifiers, and as a wave source when the active devices are oscillators.

17 Claims, 1 Drawing Sheet

QUASI-OPTICAL AMPLIFIER

TECHNICAL FIELD

The present invention relates to quasi-optical power generation and in particular to a modified photonic bandgap crystal that acts as a quasi-optical amplifier or as a frequency source.

BACKGROUND ART

Quasi-optical power generation is currently an area of great interest that is being heavily researched and funded by the Department of Defense because of a lack of frequency sources in the millimeter and sub-millimeter wave frequency ranges. High power vacuum tube devices are available, but are not practical, especially in space communication applications, due to their large size and weight. Additionally, these devices require high voltages that are costly to operate. Therefore, the research efforts described above are focused at developing a high-power solid-state frequency source at millimeter and sub-millimeter wavelengths.

To achieve the desired power, prior art devices require spatial power combining and the use of individual oscillators that must be synchronized to oscillate in the same frequency and phase.

There are several known methods used to synchronize the oscillations. These include, for example, a Fabry-Perot resonator, use of an externally injected signal, coupling between radiating elements and transmission line connections between oscillators.

Current methods of synchronization have significant drawbacks. The output power of such techniques is limited by antenna efficiency. An outside power source is required in order to generate an externally injected signal which adds cost and complexity to the system. The upper frequency of such techniques is limited by the need to interconnect oscillators. Also, the above mentioned techniques and devices, and in particular the Fabry-Perot resonator, usually require a non-planar construction which adds complexity and cost to the manufacture of such devices.

There is a need for a high-power solid-state millimeter and sub-millimeter wave source that has an integrated planar structure, is self-synchronized, and has the potential for high output power.

It is an object of the present invention to provide a high-power solid-state millimeter and sub-millimeter wave source that has an integrated planar structure, is self-synchronized, and has the potential for high output power.

It is another object of the present invention to apply active devices in the alternate layers of a photonic bandgap crystal to provide a wave source with the potential for high power output.

SUMMARY OF THE INVENTION

The present invention incorporates a photonic bandgap crystal, designed to operate within a specific frequency range, with active devices, such as amplifiers and oscillators, to create a high-power solid-state frequency source. The photonic crystal is modified to have characteristics, hereinafter called alternate layers that are also referred to as "defects". The alternate layers enhance field amplitude and, by being coupled to active devices, significantly increase the amplitude of a wave as it propagates through the photonic bandgap crystal.

A photonic bandgap crystal is a periodic, or nearly periodic, structure that supports the propagation of electromagnetic radiation except at certain bandgap frequencies. The photonic bandgap crystal has a plurality of layers, several of which are specially dimensioned and spaced so as to create a matrix of alternate layers. The alternate layers are referred to as "defects" because they are either dimensionally different from the surrounding layers of the crystal, or they contain a dielectric material that differs from the surrounding layers of the crystal.

In the present invention, the alternate layers have a predetermined absorption and are populated by active devices. The active devices are amplifiers if the crystal is to function as an amplifier, or oscillators if the crystal is to function as a wave source. The location of the active devices is chosen to coincide with the alternate layers for reasons that will be described in detail hereinafter.

The alternate layers in the crystal behave as an electromagnetic cavity, whereby the field within the cavity reaches very large amplitudes. Each layer of the photonic crystal has a refractive index and a length. The crystal is designed such that the alternate layer is surrounded on either side by a number of bi-layers. The product of all of the refractive indices and lengths of the bi-layers on one side of the alternate layer is equal to the product of the refractive indices and lengths of the bi-layers on the opposite side of the alternate layer. Each bi-layer product is equal to one-half the product of the refractive index and length of the alternate layer.

The design of the present invention allows the transmission peak induced by the alternate layer of the photonic crystal to appear at the center of the bandgap. An examination of the photonic crystal's transmittance as a function of the extinction coefficient, which quantifies the absorption in the alternate layer, indicates that for an absorption of zero, the transmittance is unity, and for an absorption less than zero, the transmittance reflects high power gain.

In effect, the coupling of the active devices to the alternate layers in the photonic crystal overcomes the absorption in the alternate layers, creating a negative absorption coefficient. The active device delivers power to the alternate layer to compensate for and overcome the losses in the alternate layer. By configuring a number of alternate layers, each one being properly compensated, a significant amount of power gain is realized.

Further features and advantages of the present invention will be apparent to those skilled in the art from the following detailed description, taken in connection with the accompanying drawings and the claims appended hereto.

BEST MODES FOR CARRYING OUT THE INVENTION

Figure 1:
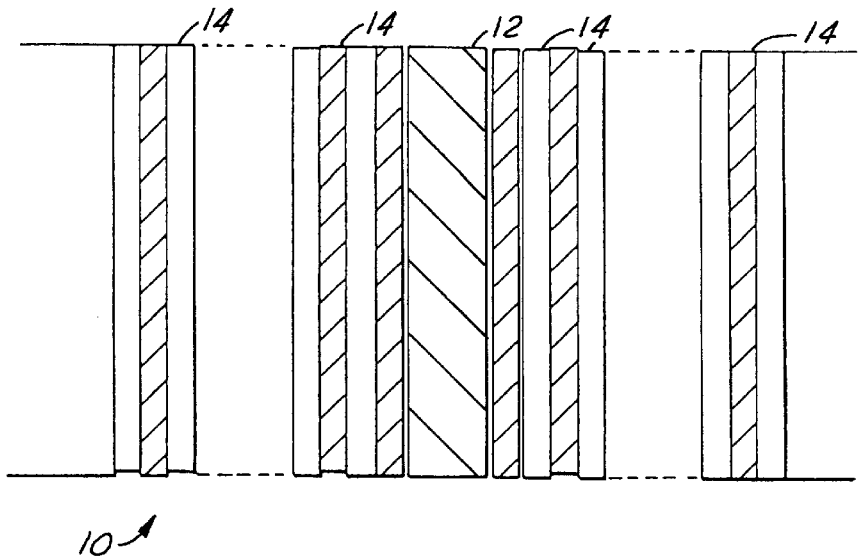
FIG. 1 is a one-dimensional model of a photonic bandgap crystal of the present invention.

Referring to FIG. 1, there is shown a one-dimensional model of a photonic bandgap crystal 10 of the present invention. The frequency response of a photonic bandgap crystal depends upon a number of parameters, such as the dielectric constant of the material used, the shape and position of the layers and their separations from each other and the presence of alternate layers, or defects. In FIG. 1 an alternate layer 12 is shown to be dimensionally different from a plurality of surrounding bi-layers 14. There are a predetermined number, N, of bi-layers 14 on either side of the alternate layer 12 determined based on the frequency bandgap desired for operation of the present invention.

Figure 2:
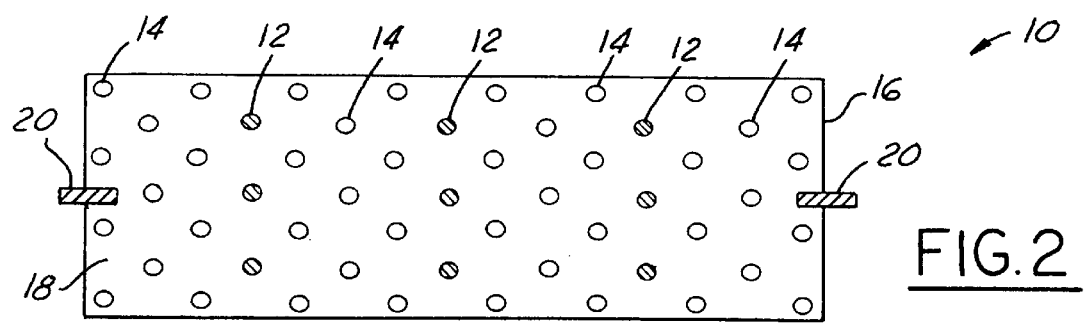
FIG. 2 is a top view of a two-dimensional photonic bandgap crystal of the present invention.
Figure 3:
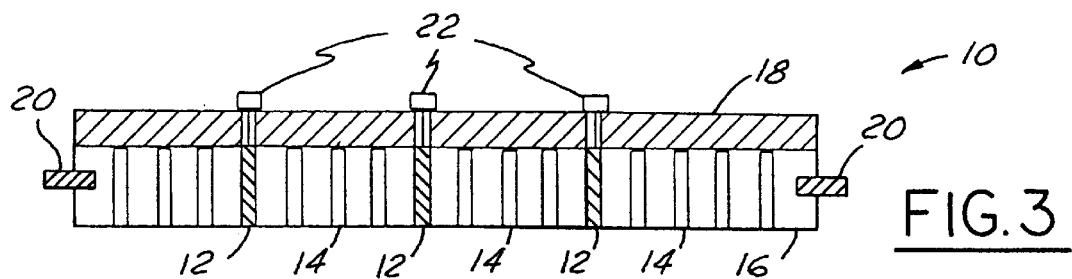
FIG. 3 is a side view of a photonic bandgap crystal of the present invention.

Referring to FIGS. 2 and 3, which illustrates a two-dimensional crystal in accordance with the present invention, the photonic bandgap crystal 10 has a substrate 16 that carries the plurality of bi-layers 14 and the alternate layers 12. The entire crystal 10 is located in a housing 18 such as a waveguide-like cavity. Connectors 20 are attached to the sides of the housing 18. The connectors 20 can be launching and receiving antennas (as shown in FIGS. 2 and 3), or waveguide input and output interfaces (not shown).

Figure 4:
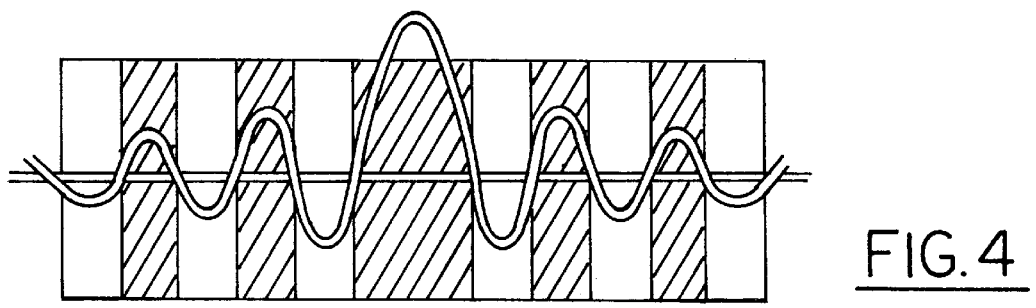
FIG. 4 is a graphical representation of the displacement field strength typical of an alternate layer of the photonic bandgap crystal of the present invention.

The alternate layers 12 of the crystal 10 are spaced throughout the crystal 10 to create a lattice of alternate layers 12. The alternate layers 12 in the photonic bandgap crystal behave as an electromagnetic cavity, wherein the alternate layers 12 the field reach very large amplitudes as shown in FIG. 4. In use, the crystal 10 is coupled to active devices 22, such as amplifiers or oscillators, strategically located in the lattice of alternate layers.

In operation, each of the alternate layers 12 has an absorption coefficient, κ, a refractive index, $n_x$, and a length, $d_x$. The bi-layers 14 have refractive indices and lengths, $n_A$, $d_A$ and $n_B$, $d_B$ respectively. The photonic bandgap crystal 10 is designed so that the relationship among the alternate layers 12 and the bi-layers 14 is as follows:

$$n_A d_A = n_B d_B = \tfrac{1}{2} n_x d_x \quad (1)$$

The design ensures the transmission peak induced by a photonic bandgap crystal alternate layer 12 appears at the center of the bandgap, in midgap position. The transmission coefficient, T, at the midgap position is given by $T=|t|^2$, where t is:

$$t = \frac{-2}{\left[2\cosh\left(\frac{\pi K}{n_X}\right) + \sinh\left(\frac{\pi K}{n_X}\right)\left[\frac{(n_B/n_A)^{2N}}{1+iK/n_X} + \frac{1+iK/n_X}{(n_B/n_A)^{2N}}\right]\right]^2}$$

For an absorption coefficient κ=0, the transmittance T is unity. For κ less than zero, the transmittance T is greater than unity. As an example, for κ=−0.008 the transmittance, T, is equal to 1920, which is a significant power gain.

The photonic bandgap crystal 10 of the present invention creates a negative absorption coefficient by coupling active devices 22 to the alternate layers 12 in order to overcome the absorption in each defect. The active device 22 delivers power to the alternate layer 12 to compensate for and overcome the losses in the alternate layer 12. When a number of alternate layers 12, i.e. a lattice of alternate layers 12, is properly compensated, significant power gain is realized.

It is also possible to provide active devices in all of the layers of the photonic bandgap crystal, that is in each of the alternative layers as well as in each of the bi-layers. Moreover, where the crystal is used as an amplifier, the input signal to the crystal can be phase-locked to the active devices.

The advantages of the present invention 10 are significant in that a high-power solid-state frequency source in the millimeter and sub-millimeter range is realized. The present invention 10 has a planar construction, thereby being less expensive to manufacture than prior art non-planar devices. The output power of the present invention 10 is not limited by antenna efficiency and is amplified within the photonic bandgap crystal. The present invention 10 may be used as either a frequency source or an amplifier.

When the present invention 10 is used as a frequency source, the active devices 22 are oscillators. The oscillators are self-locked or synchronized based on their placement in the alternate layers of the photonic bandgap crystal. There is no need for an externally injected signal. Nor is there a need for coupling the oscillators in order to achieve synchronization.

One of the benefits realized from the present invention 10 includes the use of devices with the capability for oscillations at Terahertz frequencies that are characteristically low power, i.e. a Resonant Tunneling Diode (RTD). An RTD (not shown) can be used in combination with the present invention 10 to obtain useful amounts of power.

Another benefit of the present invention 10 is that the photonic bandgap crystal retains its inherent filtering properties and therefore, one skilled in the art would recognize that the present invention is an "active" photonic crystal. Output signals at an output port of an active electronic circuit are typically accompanied by noise signals that result from spontaneous emission of electromagnetic radiation in an emission frequency band that is associated with the active electronic circuit. The photonic bandgap crystal filters the noise. Lossless filtering applications are possible with the present invention by mitigating the problem of lossy photonic crystal materials at microwave frequencies.

It is to be understood that the embodiments of the invention described above are illustrative only and that modifications thereof may occur to one skilled in the art. Accordingly, this invention is not to be regarded as limited to the embodiments disclosed herein, but is to be limited only as defined by the claims appended hereto.

What is claimed is:

1. A quasi-optical amplifier comprising:

a housing;

an input port in communication with said housing;

an output port in communication with said housing;

a photonic crystal disposed within said housing, said photonic crystal having a substrate;

a plurality of layers on said substrate, said plurality of layers having a predetermined number of bi-layers having a predetermined refractive index and a predetermined dimension;

a lattice of alternate layers interspersed among said plurality of layers, each of said alternate layers having a predetermined location and a predetermined dimension with respect to said plurality of layers, said bi-layers and said alternate layers having a relationship such that a product of said refractive index and said predetermined dimension of said bi-layers on either side of said alternate layer being equal, and a product of said refractive index and said dimension of said alternate layer being equal to twice the value of said product of each of said bi-layers; and an amplifier disposed in each of said alternate layers such that a field amplitude peak occurs at the midpoint in the predetermined dimension of each of said alternate layers creating a negative absorption and resulting in a power gain.

2. A quasi-optical oscillator comprising:

a housing;

an input port in communication with said housing;

an output port in communication with said housing;

a photonic crystal disposed within said housing, said photonic crystal having a substrate, said substrate having a plurality of layers;

a lattice of alternate layers interspersed among said plurality of layers, each of said alternate layers having a predetermined location and a predetermined dimension with respect to said plurality of layers; and an oscillator disposed within each of said alternate layers such that a field amplitude peak occurs at the midpoint in the predetermined dimension of each of said alternate layers creating a negative absorption and a frequency source having synchronized oscillations.

3. The quasi-optical oscillator as claimed in claim 2 wherein said input port further comprises a launching antenna and said output port further comprises a receiving antenna.

4. The quasi-optical oscillator as claimed in claim 2 wherein said input port further comprises an input waveguide and said output port further comprises an output waveguide.

5. The quasi-optical oscillator as claimed in claim 2 wherein said plurality of layers further comprises a predetermined number of bi-layers on either side of one of said alternate layers, said bi-layers having a predetermined refractive index and a predetermined dimension, said bi-layers and said alternate layers having a relationship such that a product of said refractive index and said predetermined dimension of said bi-layers on either side of said alternate layer being equal, and a product of said refractive index and said dimension of said alternate layer being equal to twice the value of said product of each of said bi-layers.

6. The quasi-optical oscillator as claimed in claim 5 wherein said relationship among said products of each of said bi-layers and said product of said alternate layer are controlled by said predetermined dimensions of said bi-layers and said alternate layer.

7. The quasi-optical oscillator as claimed in claim 5 wherein said relationship among said products of each of said bi-layers and said product of said alternate layer are controlled by said refractive indices of said bi-layers and said alternate layer.

8. The quasi-optical amplifier as claimed in claim 1 wherein said input port further comprises a launching antenna and said output port further comprises a receiving antenna.

9. The quasi-optical amplifier as claimed in claim 1 wherein said input port further comprises a waveguide input and said output port further comprises an waveguide output.

10. The quasi-optical amplifier as claimed in claim 1 wherein said relationship among said products of each of said bi-layers and said product of said alternate layer are controlled by said predetermined dimensions of said bi-layers and said alternate layer.

11. The quasi-optical amplifier as claimed in claim 1 wherein said relationship among said products of each of said bi-layers and said product of said alternate layer are controlled by said refractive indices of said bi-layers and said alternate layer.

12. A quasi-optical amplifier comprising:

a housing;

an input port in communication with said housing;

an output port in communication with said housing;

a photonic crystal disposed within said housing, said photonic crystal having a substrate;

a plurality of layers on said substrate;

a lattice of alternate layers interspersed among said plurality of layers, each of said alternate layers having a predetermined location and a predetermined dimension with respect to said plurality of layers; and an oscillator disposed in each of said alternate layers such that a field amplitude peak occurs at the midpoint in the predetermined dimension of each of said alternate layers creating a negative absorption.

13. The quasi-optical amplifier as claimed in claim 12 wherein said input port further comprises a launching antenna and said output port further comprises a receiving antenna.

14. The quasi-optical amplifier as claimed in claim 12 wherein said input port further comprises a waveguide input and said output port further comprises a waveguide output.

15. The quasi-optical amplifier as claimed in claim 12 wherein said plurality of layers further comprises a predetermined number of bi-layers on either side of one of said alternate layers, said bi-layers having a predetermined refractive index and a predetermined dimension, said bi-layers and said alternate layers having a relationship such that a product of said refractive index and said predetermined dimension of said bi-layers on either side of said alternate layer being equal, and a product of said refractive index and said dimension of said alternate layer being equal to twice the value of said product of each of said bi-layers.

16. The quasi-optical amplifier as claimed in claim 12 in which the input signal is phased-locked to the active devices.

17. The quasi-optical amplifier as claimed in claim 12 in which oscillators are disposed in each of said plurality of layers as well as in each of said alternate layers.

* * * * *